(12) United States Patent
Homma

(10) Patent No.: US 8,146,033 B2
(45) Date of Patent: Mar. 27, 2012

(54) MONITOR POSITION DETERMINING APPARATUS AND MONITOR POSITION DETERMINING METHOD

(75) Inventor: Katsumi Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 12/409,187

(22) Filed: Mar. 23, 2009

(65) Prior Publication Data

US 2010/0017765 A1 Jan. 21, 2010

(30) Foreign Application Priority Data

Jul. 17, 2008 (JP) ................................ 2008-186162

(51) Int. Cl.
*G06F 17/50* (2006.01)
*G06F 9/455* (2006.01)
(52) U.S. Cl. ..................... 716/106; 716/119; 716/122
(58) Field of Classification Search .................. 716/106, 716/119, 122
See application file for complete search history.

(56) References Cited

U.S. PATENT DOCUMENTS

| 6,210,983 | B1 * | 4/2001 | Atchison et al. ............... 438/14 |
| 2003/0229410 | A1 * | 12/2003 | Smith et al. ................... 700/109 |
| 2005/0235232 | A1 * | 10/2005 | Papanikolaou et al. .......... 716/1 |
| 2006/0206849 | A1 * | 9/2006 | Yamamoto ..................... 716/11 |
| 2007/0240085 | A1 * | 10/2007 | Bickford et al. ................ 716/4 |
| 2008/0052656 | A1 * | 2/2008 | Foreman et al. ................ 716/6 |
| 2008/0072198 | A1 * | 3/2008 | Celik et al. .................... 716/6 |
| 2008/0189664 | A1 * | 8/2008 | Bickford et al. ................ 716/4 |
| 2008/0209365 | A1 * | 8/2008 | Riviere-Cazaux ............... 716/4 |
| 2008/0295046 | A1 * | 11/2008 | Su et al. ......................... 716/4 |
| 2009/0100393 | A1 * | 4/2009 | Visweswariah et al. ......... 716/6 |
| 2009/0144686 | A1 * | 6/2009 | Lensing et al. ................ 716/10 |
| 2010/0146465 | A1 * | 6/2010 | Berkens et al. ................. 716/2 |

OTHER PUBLICATIONS

Ryuta Tsuchiya, et al., "Prospect of Si Semiconductor Devices and Manufacturing Technologies in Nanometer Era," Hitachi Hyouron vol. 88, No. 3, pp. 39-46, 2006.
Aseem Agarwal, et al., "Circuit Optimization using Statistical static Timing Analysis," Proc. DAC2005, pp. 321-324, Jun. 2005.
Murari Mani, et al., "An Efficient Algorithm for Statistical Minimization of Total Power under Timing Yield Constraints," Proc. DAC2005, pp. 309-314, Jun. 2005.

* cited by examiner

*Primary Examiner* — Stacy Whitmore
*Assistant Examiner* — Magid Dimyan
(74) *Attorney, Agent, or Firm* — Greer, Burns & Crain, Ltd.

(57) ABSTRACT

A monitor position determining apparatus includes an acquiring unit that acquires design data concerning circuit elements arranged in a layout of a semiconductor device and for each of the circuit elements, yield sensitivity data indicative of a percentage of change with respect to a yield ratio of the semiconductor device; a selecting unit that selects, based on the yield sensitivity data, a circuit element from a circuit element group arranged in the layout; a determining unit that determines an arrangement position in the layout to be an installation position of a monitor that measures a physical amount in the semiconductor device in a measurement region, the arrangement position being of the circuit element that is specified from the design data acquired by the acquiring unit and selected by the selecting unit; and an output unit that outputs the installation position determined by the determining unit.

11 Claims, 12 Drawing Sheets

FIG.4

| | CIRCUIT ELEMENT ID | X COORDINATE | Y COORDINATE | GATE LENGTH | GATE WIDTH | YIELD SENSITIVITY |
|---|---|---|---|---|---|---|
| 400-1 | P1 | X1 | Y1 | L1 | W1 | S1 |
| | P2 | X2 | Y2 | L2 | W2 | S2 |
| ... | ... | ... | ... | ... | ... | ... |
| 400-i | Pi | Xi | Yi | Li | Wi | Si |
| ... | ... | ... | ... | ... | ... | ... |
| 400-n | Pn | Xn | Yn | Ln | Wn | Sn |

400

| CIRCUIT ELEMENT ID | SIMILAR VECTOR DISTANCE |
|---|---|
| P1 | R1 |
| P2 | R2 |
| ⋮ | ⋮ |
| Pi | Ri |
| ⋮ | ⋮ |
| Pn | Rn |

MONITOR POSITION DETERMINING APPARATUS AND MONITOR POSITION DETERMINING METHOD

CROSS REFERENCE TO RELATED APPLICATIONS

This application is based upon and claims the benefit of priority of the prior Japanese Patent Application No. 2008-186162, filed on Jul. 17, 2008, the entire contents of which are incorporated herein by reference.

FIELD

The embodiments discussed herein are related to a technology that, based on feedback process control, improves the fabrication yield of a semiconductor device formed on a semiconductor wafer.

BACKGROUND

In recent years, with the miniaturization of technology, the influence of statistical factors, such as process variation becomes significant, increasing circuit delay, leak fluctuations, etc. Circuit delay and leak fluctuations are factors that reduce the yield ratio of a chip, and hence there is demand for a technology that controls process variation to improve yield ratio.

Conventionally, advance process control (APC), a technology that reduces variation, has been disclosed as a technology that controls variation during chip fabrication. APC is a technology that measures a physical amount (e.g., a gate length or a film thickness) of a semiconductor wafer during fabrication and feeds back a result of the measurement to control the physical amount (see, for example, Tsuchiya, Ryota; Izawa, Masaru; and Kimura, Shinichiro, "Prospect of Si Semiconductor Devices and Manufacturing Technologies in Nanometer era", Hitachi Hyoron, 2006, Vol. 88, No. 3, Line 20 in the right column on p. 44 (4.3 Problem and Prospect of Mass Production Techniques) to Line 20 in the left column on p. 45, FIG. 10)

However, according to the conventional technology, a monitor that measures a physical amount of a semiconductor wafer is arranged at a position that is critical in terms of process (e.g., a position with a reduced film thickness), while a critical position that is dependent on circuit characteristics, layout, etc. is disregarded; hence, a problem arises in that this technology cannot cope with a reduction in yield ratio due to circuit dependent factors of variation.

SUMMARY

According to an aspect of an embodiment, a monitor position determining apparatus includes an acquiring unit that acquires design data concerning circuit elements arranged in a layout of a semiconductor device and for each of the circuit elements, yield sensitivity data indicative of a percentage of change with respect to a yield ratio of the semiconductor device; a selecting unit that selects, based on the yield sensitivity data, a circuit element from a circuit element group arranged in the layout; a determining unit that determines an arrangement position in the layout to be an installation position of a monitor that measures a physical amount in the semiconductor device in a measurement region, the arrangement position being of the circuit element that is specified from the design data acquired by the acquiring unit and selected by the selecting unit; and an output unit that outputs the installation position determined by the determining unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a schematic of contents recorded in a parameter/yield sensitivity table;

DESCRIPTION OF EMBODIMENT(S)

Preferred embodiments of the present invention will be explained with reference to the accompanying drawings. According to the monitor position determining apparatus and the monitor position determining method, parameter information that is a variation factor concerning yield sensitivity and layout with respect to circuit delay, a leak fluctuation, etc. of a semiconductor device at a design stage is used to determine an installation position of an APC monitor, thereby improving fabrication yield of the semiconductor device.

Figure 1:
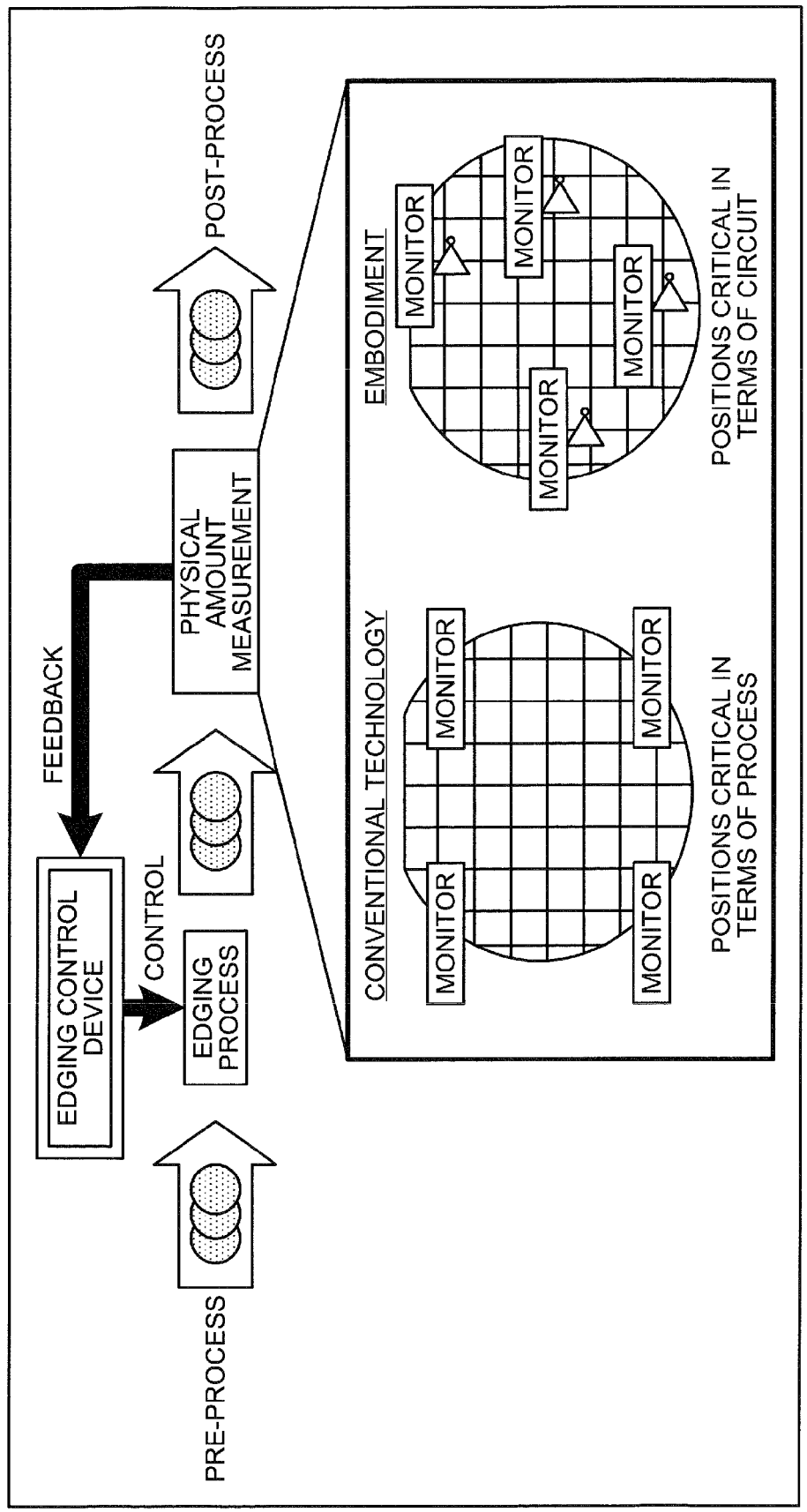
FIG. 1 is a schematic for explaining an overview of an embodiment.

FIG. 1 is a schematic for explaining an overview of an embodiment. FIG. 1 depicts an overview of a feedback type process control technology (APC) in an edging process of semiconductor device fabrication.

The APC is a technology that measures a physical amount (e.g., a gate length, a film thickness, etc.) at a specific position of a semiconductor wafer during fabrication by using a monitor (a scanning electron microscope) and feeds back a result of this measurement to an edging control device to control such a physical amount.

With respect to this technology, a position in a semiconductor wafer where a physical amount is to be measured with a limited number of monitors is important. Conventionally, a monitor of the APC is set at a position that is critical in terms of process, e.g., at an edge of a semiconductor wafer where film thickness is reduced. Here, a position at the edge of the semiconductor wafer where the monitor is set is determined at random or at the discretion of the designer. However, this method cannot take a circuit-dependent factor of variation into consideration and cannot cope with a reduction in yield ratio due to this factor in some cases.

Thus, according to the present embodiment, a position that is yield-critical in terms of circuit is specified based on circuit dependence information obtained at a design stage, and a monitor is provided at this position. Specifically, a circuit element having a high yield sensitivity is specified from among a circuit element group in a semiconductor device formed on a semiconductor wafer, and an arrangement position of this circuit element is determined as a monitor installation position.

Here, similarities between variations of circuit elements are judged using parameters serving as variation factors concerning layout, and as far as possible, each position having a different variation is determined as a monitor installation position. As a result, circuit dependent variations at a design stage can be efficiently and effectively controlled with the limited number of monitors, thereby improving process yield of a semiconductor device.

According to a first embodiment, for each element circuit of the semiconductor device, parameters that are circuit dependent variation factors are arranged in a vector space to obtain a multidimensional vector. Parameters that are variation factors include, for example, an arrangement position, a gate length, and a gate width of a circuit element in a layout of a semiconductor device.

Yield sensitivity indicative of a percentage of change in each circuit element with respect to a yield ratio of a semiconductor device in terms of circuit delay, leak fluctuation, etc. is used to perform weighting. The yield sensitivity of each circuit element can be obtained by using a computational expression acquired by a statistical analysis technique. In the present example, a higher yield sensitivity represents a circuit element that is critical with respect to a yield ratio of the semiconductor device.

Figure 2:
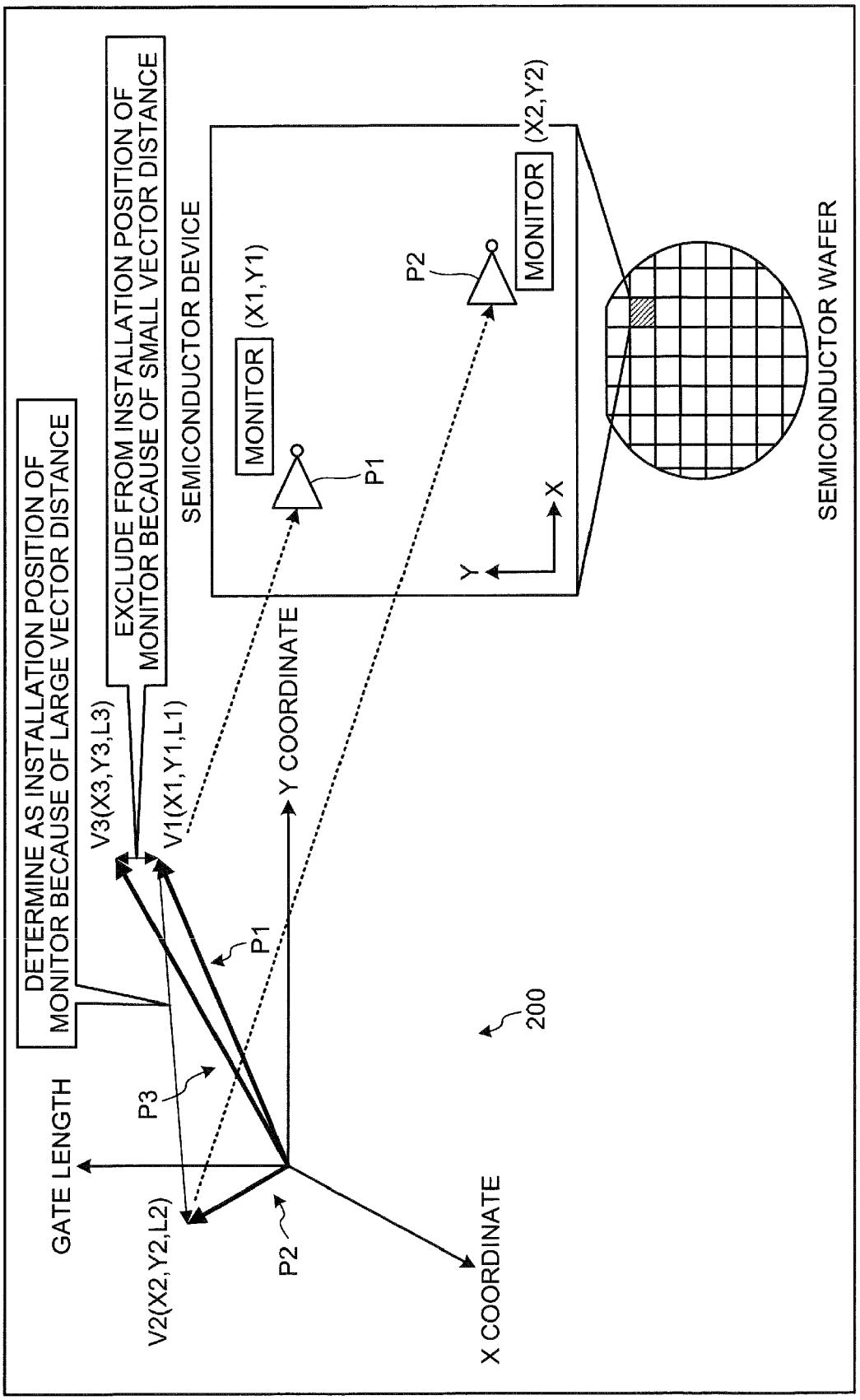
FIG. 2 is a schematic of an overview of a monitor position determining technique according to a first embodiment.

FIG. 2 is a schematic of an overview of a monitor position determining technique according to the first embodiment. As depicted in FIG. 2, vectors V1 to V3 of circuit elements P1 to P3 are depicted in a vector space 200 using three axes as parameters (an X coordinate of an arrangement position, a Y coordinate of the arrangement position, and a gate length) that become variation factors of the circuit elements P1 to P3 in a semiconductor device.

Here, yield sensitivities of the circuit elements P1 to P3 are determined as "S1 to S3", and a magnitude relationship between these sensitivities is determined as "S1>S2>S3". In this case, the circuit element P1 having the greatest yield sensitivity S1 is selected, and an arrangement position (X1, Y1) of this circuit element P1 is determined as a monitor installation position. Subsequently, the circuit element P2 having the second greatest yield sensitivity S2 is selected, and a vector distance between the vector V2 of the circuit element P2 and the vector V1 of the circuit element P1 already determined as the monitor installation position is obtained.

Here, when the vector distance between the vector V1 and the vector V2 is larger than a preset similar-vector-distance, an arrangement position (X2, Y2) of the circuit element P2 is determined as a monitor installation position. On the other hand, when the vector distance between the vector V1 and the vector V2 is less than the similar-vector-distance, variations are considered to be similar, and the arrangement position (X2, Y2) of the circuit element P2 is excluded from being a monitor installation position.

Since the vector distance between the vector V1 and the vector V2 is larger than the similar-vector-distance in this example, the arrangement position (X2, Y2) of the circuit element P2 is determined as a monitor installation position. Then, the circuit element P3 having the least yield sensitivity S3 is selected, and vector distances between the vector V3 of the circuit element P3 and the vectors V1 and V2 of the circuit elements P1 and P2 already determined as the monitor installation positions are obtained.

Since a vector distance between the vector V3 and the vector V1 is less than the similar-vector-distance, an arrangement position (X3, Y3) of the circuit element P3 is excluded from being a monitor installation position. This position is excluded to efficiently measure positions having different variations by the limited number of monitors and meanwhile, control many variations.

As explained above, according to the first embodiment, tradeoff between many parameters, e.g., yield sensitivities and similarities between variation factors of the respective circuit elements in the semiconductor device formed on a semiconductor wafer with respect to a yield ratio are adjusted to determine the installation position of each monitor. As a result, circuit dependent variations at a design stage can be controlled, thereby improving the yield ratio of the semiconductor device.

Figure 3:
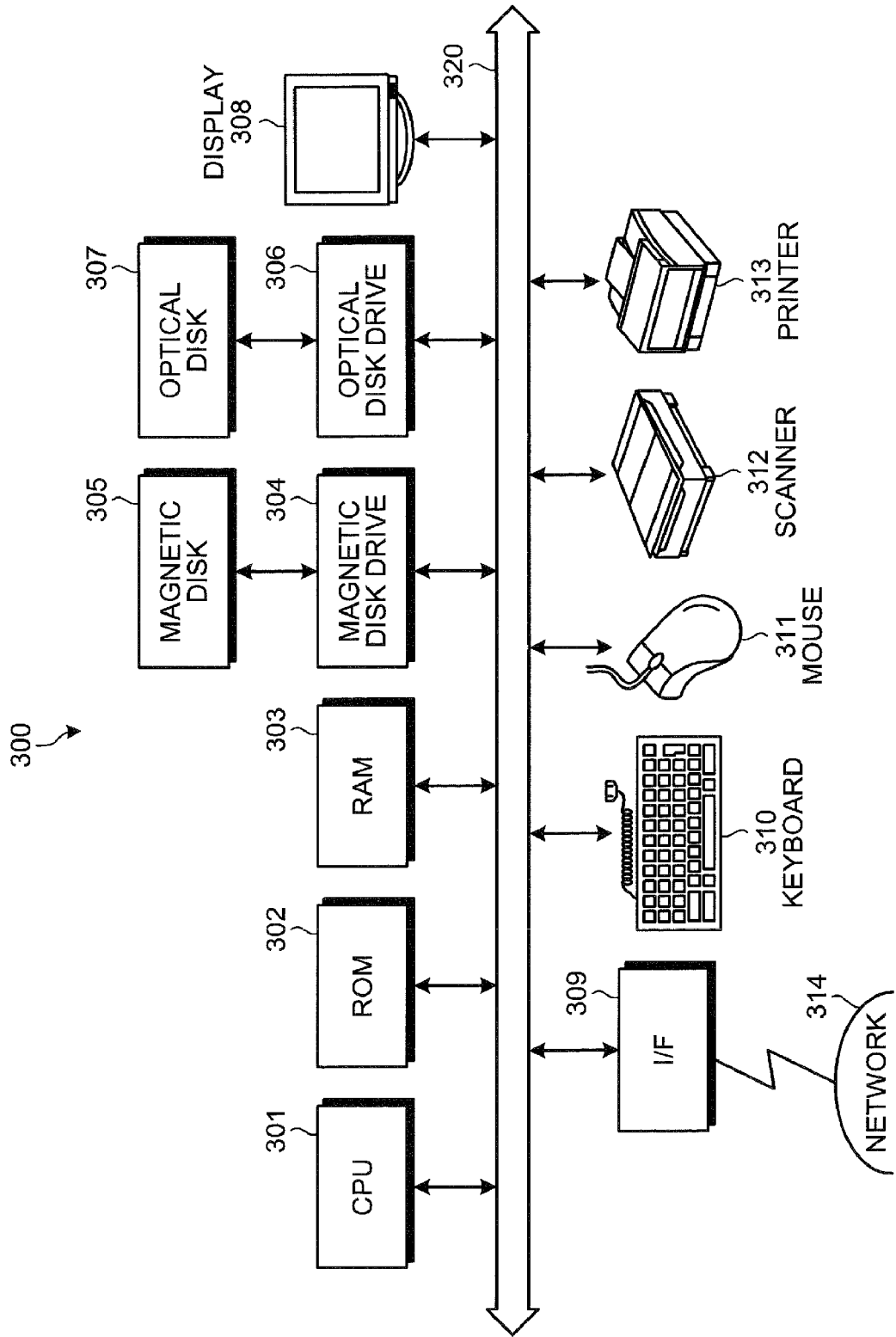
FIG. 3 is a block diagram of a monitor position determining apparatus.

FIG. 3 is a block diagram of a monitor position determining apparatus. As depicted in FIG. 3, a monitor position determining apparatus 320 includes a central processing unit (CPU) 301, a read-only memory (ROM) 302, a random access memory (RAM) 303, a magnetic disk drive 304, a magnetic disk 305, an optical disk drive 306, an optical disk 307, a display 308, a interface (I/F) 309, a keyboard 310, a mouse 311, a scanner 312, and a printer 313, connected to one another by way of a bus 320.

The CPU 301 governs overall control of the monitor position determining apparatus 300. The ROM 302 stores therein programs such as a boot program. The RAM 303 is used as a work area of the CPU 301. The magnetic disk drive 304, under the control of the CPU 301, controls the reading/writing of data from/to the magnetic disk 305. The magnetic disk 305 stores therein the data written under control of the magnetic disk drive 304.

The optical disk drive 306, under the control of the CPU 301, controls reading/writing of data from/to the optical disk 307. The optical disk 307 stores therein the data written under control of the optical disk drive 306, the data being read by a computer.

The display 308 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 308.

The I/F 309 is connected to a network 314 such as a local area network (LAN), a wide area network (WAN), and the Internet through a communication line and is connected to other apparatuses through the network 314. The I/F 309 administers an internal interface with the network 314 and controls the input/output of data from/to external apparatuses. For example, a modem or a LAN adaptor may be employed as the I/F 309.

The keyboard 310 includes, for example, keys for inputting letters, numerals, and various instructions and performs the input of data. Alternatively, a touch-panel-type input pad or numeric keypad, etc. may be adopted. The mouse 311 performs the movement of the cursor, selection of a region, or movement and size change of windows. A track ball or a joy stick may be adopted provided each respectively has a function similar to a pointing device.

The scanner 312 optically reads an image and takes in the image data into the monitor position determining apparatus 300. The scanner 312 may have an optical character recognition (OCR) function as well. The printer 313 prints image data and text data. The printer 313 may be, for example, a laser printer or an ink jet printer.

FIG. 4 is a schematic of contents recorded in a parameter/yield sensitivity table. As depicted in FIG. 4, a parameter/yield sensitivity table 400 stores circuit element information entries 400-1 to 400-n concerning the circuit elements arranged in a layout of the semiconductor device.

Specifically, for each circuit element, a corresponding circuit element information entry 400-1 to 400-n includes a circuit element ID, an X coordinate, a Y coordinate, a gate length, a gate width, and a yield sensitivity. The circuit element ID is an identifier that uniquely identifies a circuit element. The X coordinate and the Y coordinate indicate an arrangement position of a circuit element in the layout of the semiconductor device. The gate length and the gate width are a gate length and a gate width of a circuit element.

In this example, the circuit element information entries 400-1 to 400-n are sorted in descending order of yield sensitivity of the circuit elements P1 to Pn. That is, a magnitude relationship "S1>S2> . . . >Si> . . . >Sn" is obtained with the yield sensitivity S1 of the circuit element P1 arranged at the top. From the circuit element information entries 400-1 to 400-n, an arrangement position (Xi, Yi), a gate length Li, a gate width Wi, and a yield sensitivity Si for each circuit element Pi can be recognized (i=1, 2, . . . , n).

A function of the parameter/yield sensitivity table 400 is realized by storage areas, such as the RAM 303, the magnetic disk 305, and the optical disk 307 depicted in FIG. 3. Although plural semiconductor devices are formed on the semiconductor wafer, it is assumed that all of the semiconductor devices are of the same type in this embodiment.

Therefore, the circuit element information entries 400-1 to 400-n are common to all the semiconductor devices formed on the semiconductor wafer. When multiple types of semiconductor devices are formed on the semiconductor wafer, information corresponding to the circuit element information entries 400-1 to 400-n is included for each type of semiconductor device.

Figures 5, 6:
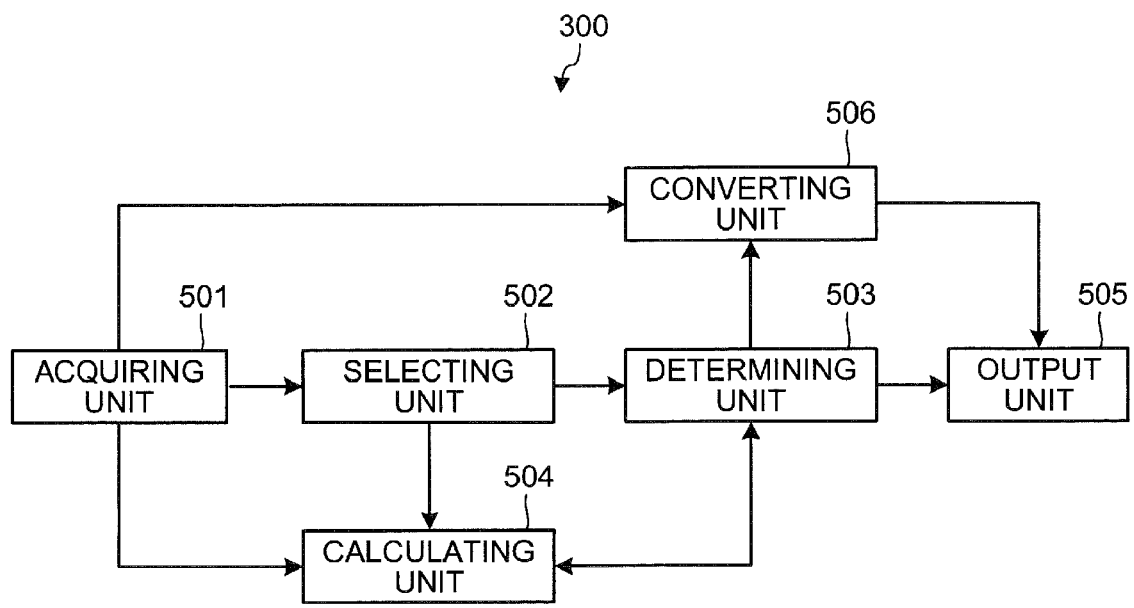
FIG. 5 is a functional diagram of the monitor position determining apparatus according to the first embodiment.
FIG. 6 is a schematic of contents recorded in a similar-vector-distance table.

FIG. 5 is a functional diagram of the monitor position determining apparatus according to the first embodiment. The monitor position determining apparatus 300 includes an acquiring unit 501, a selecting unit 502, a determining unit 503, a calculating unit 504, an output unit 505, and a converting unit 506.

A function of a control unit (the acquiring unit 501 to the converting unit 506) is realized by, for example, the CPU 301 executing a program stored in a storage area, such as the ROM 302, the RAM 303, the magnetic disk 305, and the optical disk 307 depicted in FIG. 3 or by an I/F 309.

The acquiring unit 501 has a function of acquiring design data concerning the circuit elements arranged in the layout of the semiconductor device and for each circuit element, yield sensitivity data indicative of a percentage of a change with respect to a yield ratio of the semiconductor device. The semiconductor device means an arbitrary semiconductor device selected from among the semiconductor devices formed on the semiconductor wafer.

The design data is information that specifies a dimension and the arrangement position for each circuit element (e.g., a transistor, a wiring line, a resistor, a capacitor, etc.). Specifically, the design data is information including, e.g., a net list, floor plan information, and layout information of the semiconductor device.

The yield sensitivity data is information indicative of a percentage of change with respect to yield ratio (circuit delay, leak fluctuation, etc.) when a gate length, a gate width, etc. of a circuit element has changed. For each circuit element, yield sensitivity can be obtained by, for example, using a computational expression acquired at a design stage by a statistical analysis technique.

Specifically, for example, the yield sensitivity of a leak fluctuation with respect to a yield ratio when a gate length of a circuit element has changed can be obtained using equation (1), where n is the total number of circuit elements in the semiconductor device; Si is a yield sensitivity of the circuit element Pi (i=1, 2, . . . , n); IS(i)(L1, L2, . . . , Li, . . . , Ln) is an equation for calculating the yield sensitivity for the circuit element Pi; Li is a gate length of the circuit element Pi; and $I_x$(L1, L2, . . . , Li, . . . , Ln) is a leak value function of a yield ratio x ($0 \leq x \leq 1$).

$$Si = IS(i)(L1, L2, \ldots, Li, \ldots, Ln) \quad (1)$$
$$= (\partial I_x / \partial Li)(L1, L2, \ldots, Li, \ldots, Ln)$$

The equation for calculating yield sensitivity (a leak value function) can be obtained by using, for example, a statistical analysis technique at the design stage. A specific technique for obtaining the equation to calculate yield sensitivity (the leak value function) is a known technology and although an explanation thereof will be omitted herein, reference can be made to, for example, Agarwal, Aseem, "Circuit Optimization using Statistical Static Timing Analysis", Proc. DAC2005, pp. 321-324; and Mani, Murari, "An Efficient Algorithm for Statistical Minimization of Total Power under Timing Yield Constrains", Proc. DAC2005, pp. 309-314.

The design data and the yield sensitivity data acquired by the acquiring unit 501 are sorted, for example, in descending order of yield sensitivity of the circuit elements, and are stored in the parameter/yield sensitivity table 400 depicted in FIG. 4. The design data and the yield sensitivity data may be input through a user manipulation of the keyboard 310 or the mouse 311 depicted in FIG. 3, or may be acquired based on extraction from a database or a library.

The selecting unit 502 has a function of selecting an arbitrary circuit element from the circuit element group arranged in the layout of the semiconductor device, based on the yield sensitivity data acquired by the acquiring unit 501. Specifically, for example, the parameter/yield sensitivity table 400 is referenced to select the circuit element P1 having the greatest yield sensitivity among the circuit elements P1 to Pn. A selection result is stored in a storage area, such as the RAM 303, the magnetic disk 305, and the optical disk 307.

The determining unit 503 has a function of determining the arrangement position of the circuit element selected by the selecting unit 502 in the layout of the semiconductor device to be an installation position of a monitor that measures a physical amount of the semiconductor device in a measurement region. The arrangement position of each circuit element in the layout of the semiconductor device can be specified from the design data acquired by the acquiring unit 501.

In the example, the determining unit 503 determines the arrangement position (X1, Y2) of the circuit element P1 specified from the parameter/yield sensitivity table 400 to be an installation position of a monitor. A determination result is stored in a storage area, such as the RAM 303, the magnetic disk 305, and the optical disk 307.

The selection processing performed by the selecting unit 502 may be repeatedly executed until, for example, there are no circuit elements that have yet to be selected among the circuit element group, or until the number of the monitors assigned installation positions determined by the determining unit 503 reaches a preset number (hereinafter, "monitor number Kc").

For example, when the monitor number Kc of the monitors that can be provided in one semiconductor device on the semiconductor wafer is set to "5", the selection processing performed by the selecting unit 502 is repeatedly executed until there are no circuit elements that have yet to be selected among the circuit element group or until the number of monitors having installation positions determined by the determining unit 503 reaches "5".

The monitor number Kc is, for example, a numerical value set according to each semiconductor device (or each type of semiconductor device) formed on the semiconductor wafer, and can be set arbitrarily by a user manipulation of the keyboard 310 or the mouse 311 depicted in FIG. 3. The set monitor number Kc is stored in a storage area, such as the RAM 303, the magnetic disk 305, and the optical disk 307.

A specific numerical value set as the monitor number Kc is determined based on a fabrication lead time until a product is brought to market or a required quality. Specifically, although a physical amount of the semiconductor device can be measured in a wider range when the monitor number Kc is increased, the measuring time also increases; hence, an appropriate numerical value according to fabrication lead time or product quality is set.

The selecting unit 502 may select a circuit element having the greatest yield sensitivity among circuit elements that have yet to be selected among the circuit element group. Specifically, for example, the parameter/yield sensitivity table 400 is referenced to select the circuit elements P1 to Pn in descending order of the yield sensitivities S1 to Sn (the circuit element P1→the circuit element P2→ . . . ).

Here, an installation position for each monitor is determined with consideration of the degree of similarity between variations of the circuit elements to prevent regions in the semiconductor device having similar variations concerning the layout (variations of a process) from being redundantly measured. Specifically, for example, variations of the circuit elements whose arrangement positions in the layout are close to each other are similar, and variations of the circuit elements whose gate lengths or gate widths are substantially equivalent are similar. It can be said that variations are similar when a correlation of variation distributions is large, and that variations differ when a correlation of variation distributions is small.

The calculating unit 504 has a function of calculating the degree of similarity between variations of a circuit element selected by the selecting unit 502 (hereinafter, "selected element") and a circuit element determined as a monitor installation position by the determining unit 503 (hereinafter, "monitor element"), based on the design data acquired by the acquiring unit 501. Here, when plural monitor elements are present, the degree of similarity between variations of the respective monitor elements and a selected element is calculated. An obtained calculation result is stored in a storage area, such as the RAM 303, the magnetic disk 305, and the optical disk 307.

Specifically, for example, the calculating unit 504 may calculate a distance between a vector obtained by arranging design data concerning a selected element in the vector space and a vector obtained by arranging design data concerning the monitor element in the vector space. That is, a distance between vectors obtained by arranging various kinds of parameters that are variation factors is calculated as an index that is used to judge a degree of similarity between circuit elements. The degree of similarity between circuit elements decreases as the distance increases, and the degree of similarity between circuit elements increases as the distance decreases.

Assuming that parameters that are variation factors include an X coordinate and a Y coordinate of an arrangement position, a gate length, and a gate width of each of the circuit elements P1 to Pn, then a distance $R_{ji}$ between a vector of a selected element Pi and a vector of a monitor element Pj can be obtained by using, for example, equation (2), where i=1, 2, . . . , n, j=1, 2, . . . , n (j≠i); $a_X$, $a_Y$, $a_L$, and $a_W$ are parameter (the X coordinate, the Y coordinate, the gate length, and the gate width) specific distance coefficients.

$$R_{ji}=a_x(Xj-Xi)2+aY(Yj-Yi)2+aL(Lj-Li)2+aW(Wj-Wi)2 \qquad (2)$$

The distance coefficients $a_X$, $a_Y$, $a_L$, and $a_W$ in equation (2) can be arbitrarily set. Equation (2) may be input by, for example, a user manipulation of the keyboard 310 or the mouse 311, or may be acquired based on extraction from a database or a library. The input equation (2) is stored in a storage area, such as the RAM 303, the magnetic disk 305, and the optical disk 307.

The determining unit 503 determines the arrangement position of the selected element to be an installation position of the monitor based on a calculation result obtained by the calculating unit 504. Specifically, for example, the determining unit 503 may determine the arrangement position of the selected element to be an installation position of a monitor when a distance between vectors calculated by the calculating unit 504 is larger than a preset threshold value. An obtained determination result is stored in a storage area, such as the RAM 303, the magnetic disk 305, and the optical disk 307.

The threshold value is arbitrarily set with respect to each circuit element (each selected element) in the semiconductor device in advance. In this example, it can be said that variations of the selected element and the monitor element are similar when a distance between vectors calculated by the calculating unit 504 is not greater than the threshold value of the selected element. A distance between vectors calculated by the calculating unit 504 will be referred to as a "vector distance", and a threshold value concerning the distance and set with respect to each circuit element will be referred to as a "similar-vector-distance" hereinafter.

FIG. 6 is a schematic of contents recorded in a similar-vector-distance table. As depicted in FIG. 6, a similar-vector-distance table 600 stores similar-vector-distances R1 to Rn for the respective circuit elements P1 to Pn.

From the similar-vector-distance table 600, the similar-vector-distances R1 to Rn of the respective circuit elements P1 to Pn can be recognized. The similar-vector-distance table 600 may be input by a user manipulation of the keyboard 310 or the mouse 311 depicted in FIG. 3, or may be acquired based on extraction from a database or a library. The input similar-vector-distance table 600 is stored in a storage area, such as the RAM 303, the magnetic disk 305, and the optical disk 307.

Assuming that the selected element is the circuit element P3 and the monitor element is the circuit element P1 among the circuit elements P1 to Pn, the calculating unit 504 refers to the parameter/yield sensitivity table 400 and substitutes values for various parameters into equation (2) to obtain a vector distance $R_{13}$ between the circuit element P1 and the circuit element P3.

Thereafter, the determining unit 503 refers to the similar-vector-distance table 600 and compares the vector distance $R_{13}$ (the distance between the circuit element P1 and the circuit element P3) with a similar-vector-distance R3 of the circuit element P3 (the selected element). If "$R_{13}$>R3", the arrangement position of the circuit element P3 is determined as an installation a monitor.

When plural monitor elements are present, respective vector distances between the monitor elements and the selected element are calculated. The number of the monitor elements will be referred to as "Z" hereinafter. For example, when the monitor elements include not only the circuit element P1 but also the circuit element P2 (Z=2) the calculating unit 504 uses equation (2) to obtain the vector distance $R_{13}$ between the circuit element P1 and the circuit element P3 and a vector distance $R_{23}$ between the circuit element P2 and the circuit element P3.

The determining unit 503 compares the vector distance $R_{13}$ with the similar-vector-distance R3 and also compares the vector distance $R_{23}$ with the similar-vector-distance R3. The arrangement position of the circuit element P3 is determined to be an installation position of a monitor only when "$R_{13}$>R3" and "$R_{23}$>R3" are true.

When the monitor elements are present in this manner, vector distances between the monitor elements and the selected element are calculated and compared with the similar-vector-distance of the selected element. The arrangement position of the selected element is determined to be an installation position of a monitor only when all the vector distances are larger than the similar-vector-distance.

The output unit 505 has a function of outputting installation positions of the monitors determined by the determining unit 503. Specifically, for example, the output unit 504 may output monitor position information indicative of installation positions of the monitors in the layout of the semiconductor device. Forms of output by the output unit 505 include, for example, display on the display 308, print output by the printer 313, and transmission to an external device by the I/F 309. The output from the output unit may be stored in a storage area, such as the RAM 303, the magnetic disk 305, and the optical disk 307.

Figure 7:
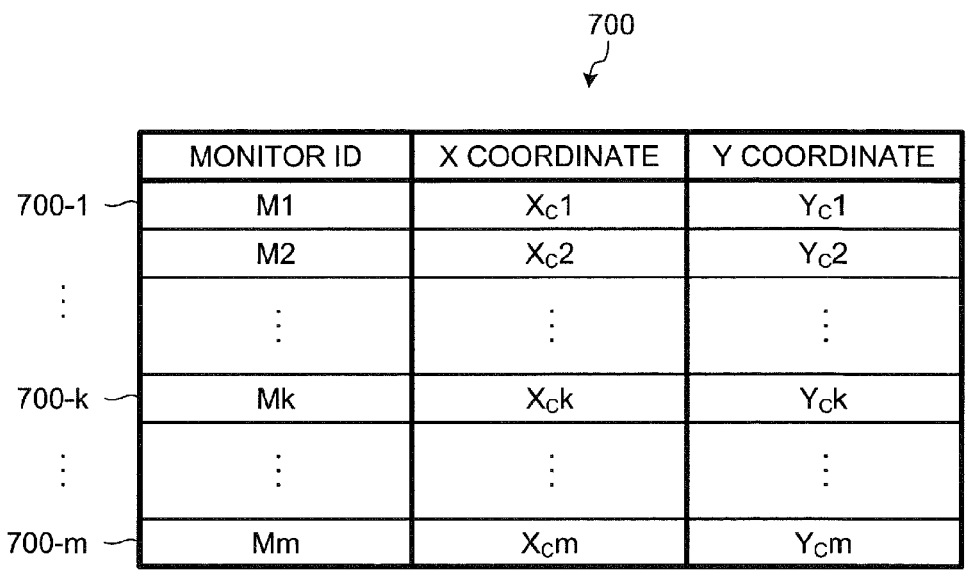
FIG. 7 is a schematic of an exemplary monitor position table.

FIG. 7 is a schematic of an exemplary monitor position table. As depicted in FIG. 7, a monitor position table 700 includes monitor position information entries 700-1 to 700-m indicative of installation positions of monitors M1 to Mm in the layout of the semiconductor device.

Specifically, the monitor position information entries 700-1 to 700-m respectively include a monitor ID, an X coordinate, and a Y coordinate. The monitor ID is an identifier that uniquely identifies a monitor. The X coordinate and the Y coordinate are indicative of a coordinate position in a coordinate system of the semiconductor device. From the monitor position table 700, coordinate positions of the monitor M1 to Mm in the coordinate system of the semiconductor device can be recognized. For example, a coordinate position of a monitor Mk is $(X,Y)=(X_ck, Y_ck)$.

Plural semiconductor devices (chips) are formed on the semiconductor wafer. For example, when a wafer size (a diameter) of the semiconductor wafer is "300 mm" and a chip size thereof is "7×7 mm", approximately 1360 semiconductor devices are formed on the semiconductor wafer. However, installation positions of the monitors determined by the above-explained technique are coordinate positions in the coordinate system of each semiconductor device.

Therefore, the installation positions of the monitors in the coordinate system of the semiconductor device must be converted into coordinates to specify the installation positions of the monitors in a coordinate system of the semiconductor wafer when the APC is applied. A specific technique for converting the installation positions of the monitors into coordinates will be explained hereinafter. An example where p semiconductor devices C1 to Cp that are of the same type and are formed on the semiconductor wafer will be explained.

Figure 8:
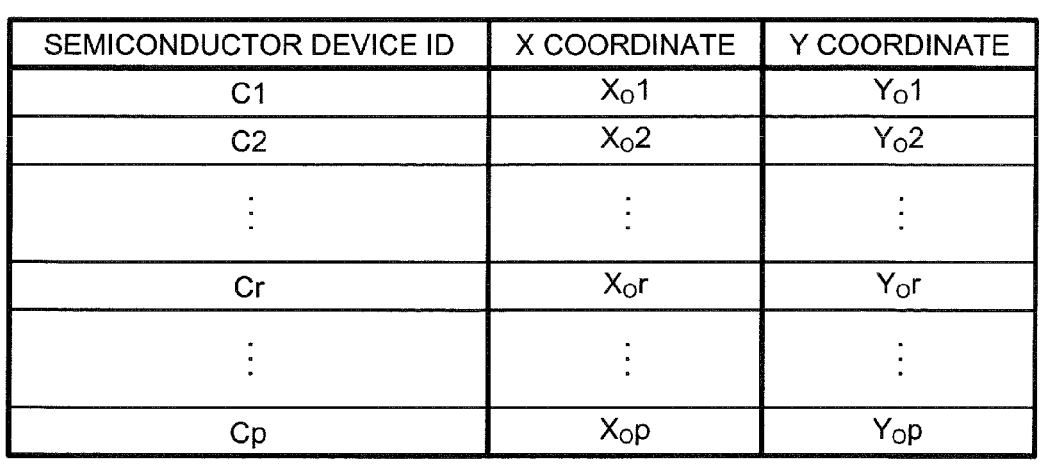
FIG. 8 is a schematic of an exemplary original point table.

An original point table storing original point positions of the semiconductor devices C1 to Cp on the semiconductor wafer will be explained first. FIG. 8 is a schematic of an exemplary original point table. As depicted in FIG. 8, an original point table 800 stores X coordinates and Y coordinates indicative of original point positions of the semiconductor devices C1 to Cp formed on the semiconductor wafer. The X coordinates and the Y coordinates here are those in the coordinate system of the semiconductor wafer.

From the original point table 800, original point positions of the semiconductor devices C1 to Cp in the coordinate system of the semiconductor wafer can be specified. For example, an original point position of a semiconductor device Cr is $(X,Y)=(X_or, Y_or)$. The original point table 800 may be input by, for example, a user manipulation of the keyboard 310 or the mouse 311, or may be acquired based on extraction from a database or a library. The input original point table 800 is stored in a storage area, such as the RAM 303, the magnetic disk 305, and the optical disk 307.

The explanation with reference to FIG. 5 continues. The converting unit 506 has a function of using an original point position of the semiconductor device on the semiconductor wafer and an arrangement position determined as an installation position of the monitor by the determining unit 503 to convert the installation position of the monitor in the coordinate system of the semiconductor device into an installation position of the monitor in the coordinate system of the semiconductor wafer. An obtained conversion result is stored in a storage area, such as the RAM 303, the magnetic disk 305, and the optical disk 307.

Specifically, for example, an installation position of the monitor in the coordinate system of the semiconductor device can be converted into an installation position of the monitor in the coordinate system of the semiconductor wafer using equations (3) and (4), where an X coordinate of a monitor $M_wq$ in the coordinate system of the semiconductor wafer is $X_wq$; a Y coordinate of the same is $Y_wq$; the total number of the monitors on the semiconductor wafer is mp; q=1, 2, ..., mp; r=1, 2, ..., p; and i=1, 2, ..., n.

$$X_w q = X_o r + Xi \quad (3)$$

$$Y_w q = Y_o r + Yi \quad (4)$$

For example, if a coordinate position $(X_o1, Y_o1)$ of a monitor M1 in the coordinate system of the semiconductor device C1 is converted into a coordinate position in the coordinate system of the semiconductor wafer, since r=1, i=1, and q=1×1=1, then, $(X_w1, Y_w1) = (X_o1 + X1, Y_o1 + Y1)$.

Equations (3) and (4) may be input by, for example, a user manipulation of the keyboard 310 or the mouse 311, or may be acquired based on extraction from a database or a library. The input equations (3) and (4) are stored in a storage area, such as the RAM 303, the magnetic disk 305, and the optical disk 307.

Figure 9:
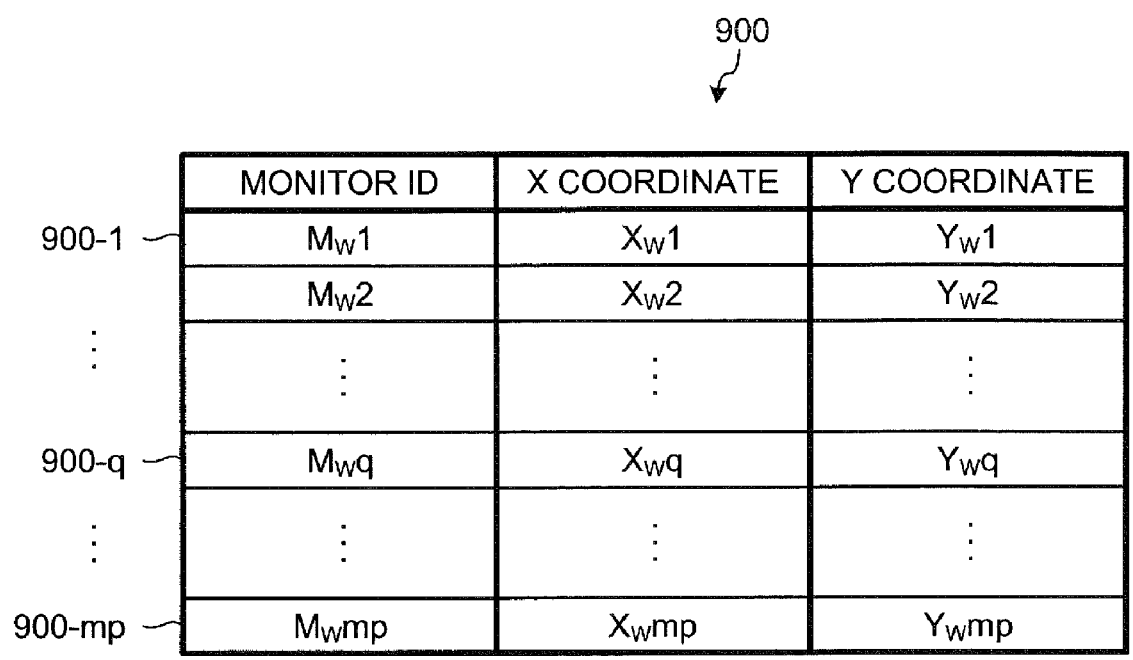
FIG. 9 is schematic of another exemplary monitor position table.

The output unit 505 may output a converted installation position of the monitor obtained by the converting unit 506. A specific example of an output result obtained by the output unit 505 will be explained. FIG. 9 is schematic of another exemplary monitor position table. As depicted in FIG. 9, a monitor position table 900 includes monitor position information entries 900-1 to 900-mp indicative of installation positions of monitors $M_w 1$ to $M_w mp$ on the semiconductor wafer.

Specifically, the monitor position information entries 900-1 to 900-mp respectively include a monitor ID, an X coordinate, and a Y coordinate. From the monitor position table 900, coordinate positions of the monitors M1 to Mmp in the coordinate system of the semiconductor wafer can be recognized. For example, a coordinate position of the monitor $M_w q$ in the coordinate system of the semiconductor wafer is $(X,Y)=(X_w q, Y_w q)$.

Among the monitors $M_w 1$ to $M_w mp$ to be mounted on the semiconductor wafer, the converting unit 506 may perform coordinate conversion with respect to only a monitor to be mounted at a position critical in terms of process of the semiconductor wafer (e.g., an edge of the semiconductor wafer). Specifically, for example, information that specifies an edge of a semiconductor wafer and an original point position of a semiconductor device on the semiconductor wafer are used to specify a semiconductor device formed at the edge of the semiconductor wafer.

A monitor that is to be provided at an arrangement position of the semiconductor device is specified, and this monitor alone is subject to coordinate conversion from the coordinate system of the semiconductor device to the coordinate system of the semiconductor wafer. The edge of the semiconductor wafer represents, for example, a region on an inner side, approximately three to five percent of a diameter from an end of the semiconductor wafer. The information that specifies the edge of the semiconductor wafer may be preset, or may be input by a user manipulation of the keyboard 310 or the mouse 311. Thus, a coordinate position of the monitor that measures a physical amount at a position critical in terms of process and circuit in the coordinate system of the semiconductor wafer can be recognized.

Figure 10:
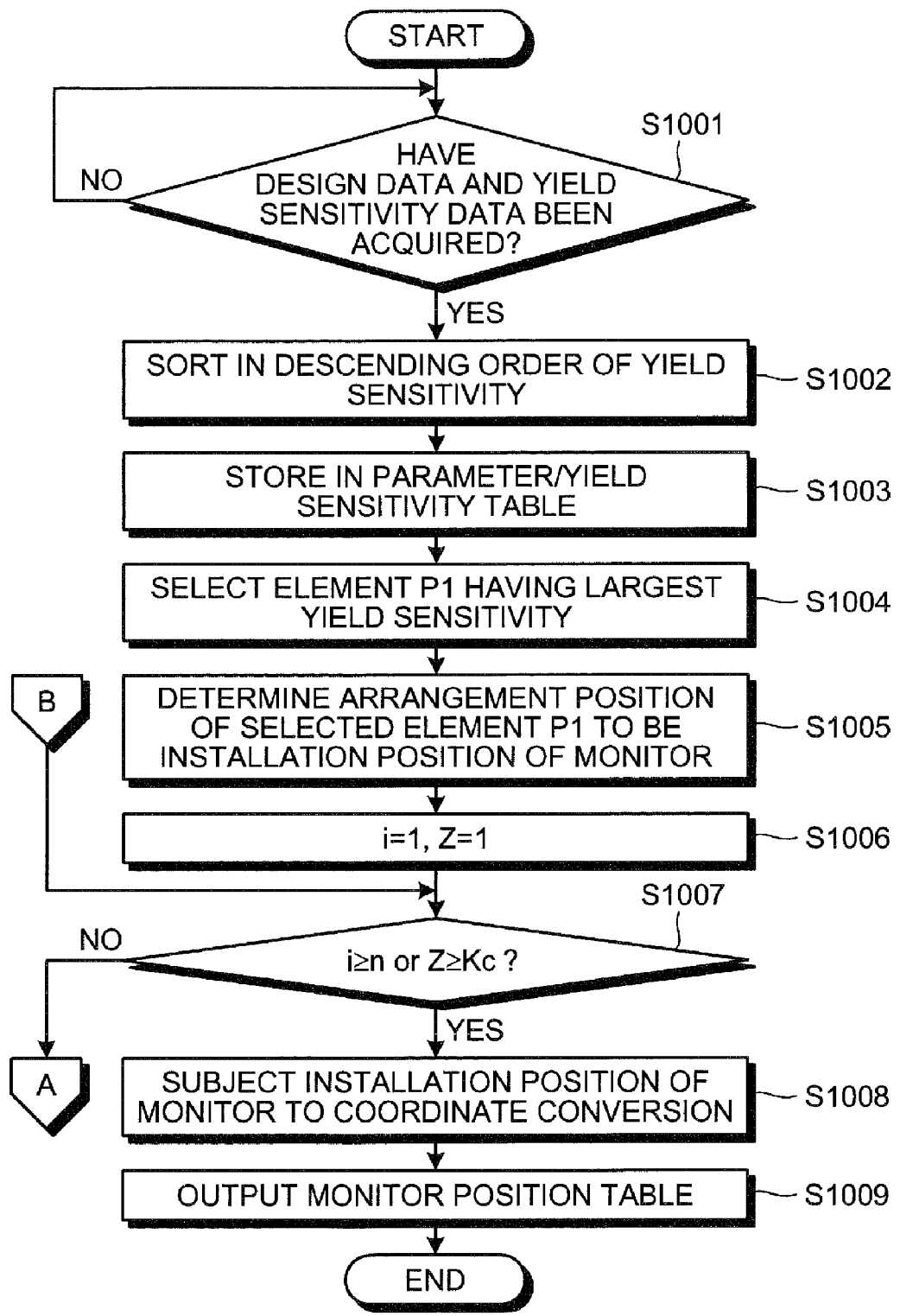
FIGS. 10 and 11 are flowcharts of an example of processing for determining monitor position.
Figure 11:
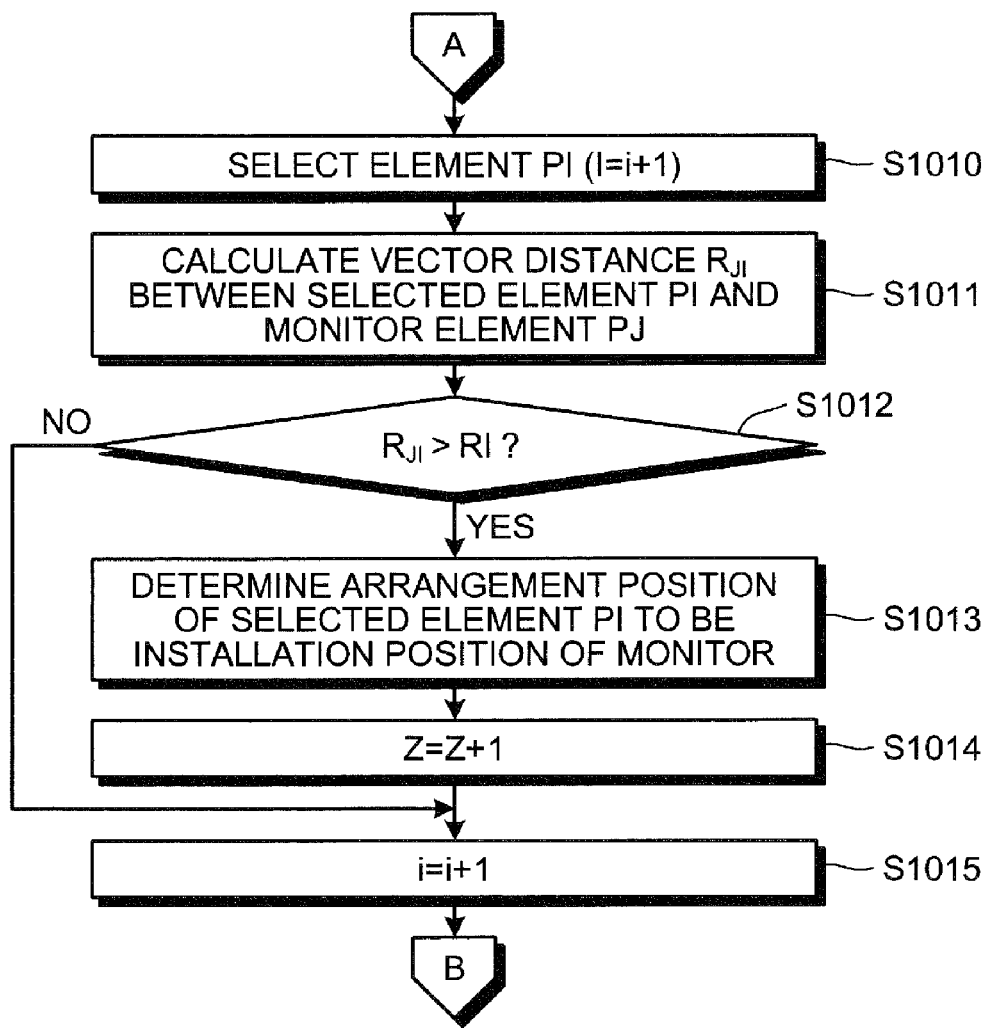

FIGS. 10 and 11 are flowcharts of an example of processing for determining monitor position.

As depicted in the flowchart of FIG. 10, it is determined whether the acquiring unit 501 has acquired design data concerning each circuit element arranged in the layout of the semiconductor device formed on the semiconductor wafer and for each circuit element, yield sensitivity data indicative of a percentage of a change with respect to a yield ratio of the semiconductor device (step S1001).

Waiting occurs for the design data and the yield sensitivity data to be acquired (step S1001: NO); if the data are acquired (step S1001: YES), the design data and the yield sensitivity data are sorted in descending order of yield sensitivity (step S1002) and stored in the parameter/yield sensitivity table 400 (step S1003).

The selecting unit 502 refers to the parameter/yield sensitivity table 400 to select the element P1 having the greatest yield sensitivity among the circuit elements P1 to Pn (step S1004), and the determining unit 503 determines the arrangement position of the selected element P1 in the layout of the semiconductor device to be an installation position of a monitor that measures a physical amount on the semiconductor device in a measurement region (step S1005).

Subsequently, i=1 and Z=1 are set (step S1006), and whether "i≧n" or "Z≧Kc" is true is judged (step S1007). When "i<n" or "Z<Kc" is true (step S1007: NO), the processing advances to step S1010 depicted in FIG. 11. Z represents the number of the monitor elements and Kc represents the number of the monitors that can be provided in the semiconductor device.

When "i≧n" or "Z≧Kc" is true (step S1007: YES), the converting unit 506 uses an original point position of the semiconductor device on the semiconductor wafer and the arrangement position of the monitor element determined as the installation position of the monitor by the determining unit 503 to convert the installation position of the monitor in the coordinate system of the semiconductor device into an installation position of the monitor in the coordinate system of the semiconductor wafer (step S1008).

The output unit 505 outputs the monitor position table 900 storing the installation position of the monitor converted by the converting unit 506 (step S1009), and a series of processing based on the flowchart is terminated.

Subsequently, in the flowchart depicted in FIG. 11, the selecting unit 502 refers to the parameter/yield sensitivity table 400 to select an element PI (where I=i+1) from the circuit elements P1 to Pn (step S1010).

The calculating unit 504 calculates a vector distance $R_{JI}$ between the selected element PI and a monitor element PJ (where PJ is a circuit element ID set of monitor elements) using equation (2) (step S1011). Here, in equation (2), "i→I" and "j→J".

Thereafter, the determining unit 503 determines whether "$R_{JI}$>RI" is true (step S1012). If "$R_{JI}$>RI" is true (step S1012: YES), the arrangement position of the selected element PI is determined to be an installation position of a monitor (step S1013). Z is incremented by one (step S1014), i is also incremented by one (step S1015), and the processing advances to step S1007 depicted in FIG. 10.

If "$R_{JI}$≦RI" is true at the step S1012 (step S1012: NO) is incremented by one (step S1015), and the processing proceeds to step S1007 depicted in FIG. 10.

According to the first embodiment explained above, an arrangement position of a circuit element that is critical to a yield ratio of circuit delay or a leak fluctuation can be determined as an installation position of a monitor by using the yield sensitivity of each circuit element in the semiconductor device. Similarities between variations of circuit elements can be calculated using a value of each parameter that is a variation factor concerning the layout.

The arrangement position of a circuit element having a different variation can be determined as an installation position of a monitor while considering the degree of similarity between variations of the circuit elements. As a result, multiple variations in the semiconductor device can be controlled with the limited number of monitors. Performing coordinate conversion of an installation position of a monitor in the coordinate system of the semiconductor device enables specification of an installation position of the monitor in the coordinate system of the semiconductor wafer.

Thus, according to the first embodiment, a physical amount of the semiconductor device can be efficiently and effectively measured with a limited number of monitors, and controlling circuit dependent variations at a design stage based on a result of this measurement enables improved fabrication yield of the semiconductor device.

In the first embodiment, the technique of determining, as an installation position of a monitor, the arrangement position of each circuit element whose variation is not similar to that of a monitor element determined as the installation position of the monitor, the determination being made in descending order of yield sensitivity among the circuit element group in the semiconductor device, is explained.

In a second embodiment, a technique of first narrowing down a set of circuit elements each having a yield sensitivity equal to or above a predetermined threshold value from a circuit element group as a set of monitor element candidates and then determining, as an installation position of a monitor, the arrangement position of each circuit element whose variation is not similar to that of a monitor element determined as the installation position of a monitor as far as possible in descending order of yield sensitivity from the narrowed candidate set will be explained. Diagrammatic representations and explanations of parts equivalent to those explained in the first embodiment will be omitted.

Figure 12:
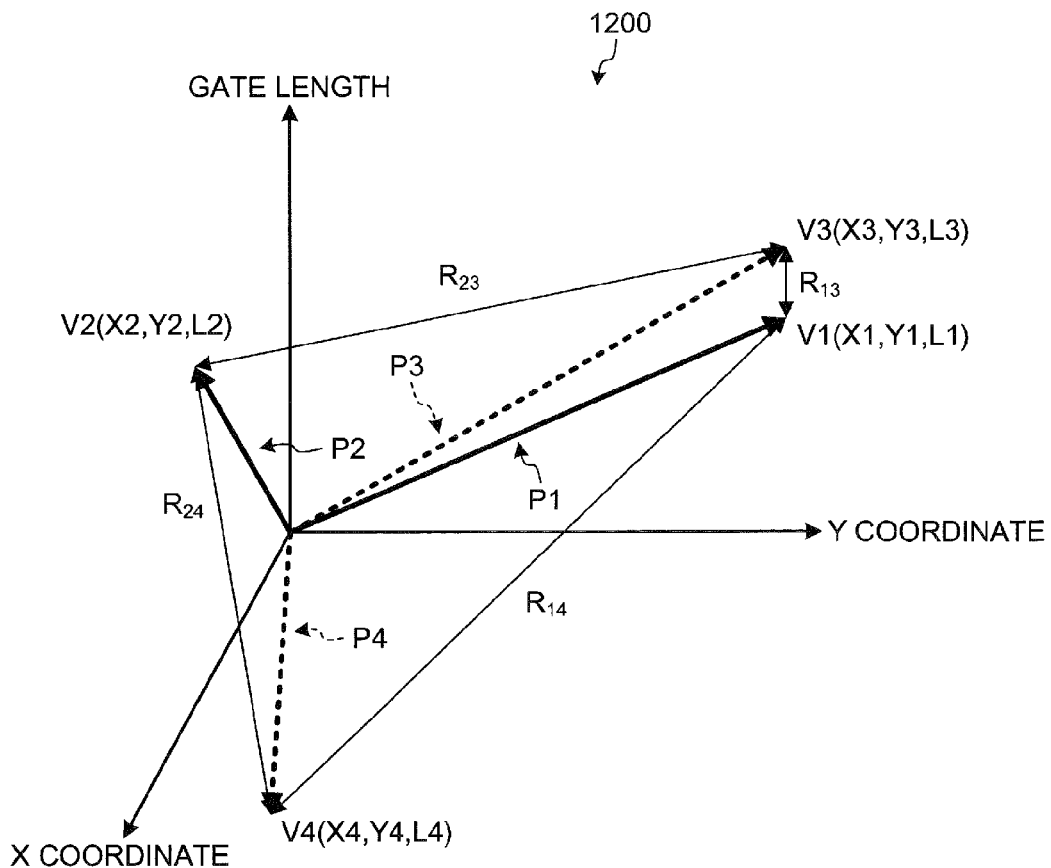
FIG. 12 is a schematic of an overview of the monitor position determining technique according to the second embodiment.

FIG. 12 is a schematic of an overview of a monitor position determining technique according to the second embodiment. As depicted in FIG. 12, vectors V1 to V4 of circuit elements P1 to P4 are depicted as axes in a vector space 1200 having three parameters (an X coordinate, a Y coordinate, and a gate length) that are variation factors. These circuit elements P1 to P4 form a set of candidates each having a yield sensitivity equal to or above a predetermined threshold value.

In this example, each of the circuit elements P1 and P2 is a monitor element already determined as a monitor installation position. In this case, vector distances between circuit elements P3 and P4 (undetermined elements) that are not determined as monitor installation positions among the set of candidates P1 to P4 and the monitor elements P1 and P2 are obtained. Specifically, vector distances $\{R_{13}, R_{23}\}$ between the undermined element P3 and the monitor elements P1 and P2 and vector distances $\{R_{14}, R_{24}\}$ between the undetermined element P4 and the monitor elements P1 and P2 are obtained.

The smallest vector distance (e.g., the vector distance $R_{13}$) that is the smallest among the vector distances $\{R_{13}, R_{23}\}$ is compared with the smallest vector distance (e.g., the vector distance $R_{24}$) that is the smallest among the vector distances $\{R_{14}, R_{24}\}$ to identify the largest among the smallest vector distances compared (e.g., the vector distance $R_{24}$).

The arrangement position of the circuit element associated with the identified largest vector distance is determined as an installation position of a monitor. For example, when the vector distance $R_{24}$ is selected as the largest vector distance, the arrangement position of the circuit element P4 associated therewith can be determined to be an installation position of a monitor.

As explained above, according to the second embodiment, the arrangement position of the circuit element P4, which is apart from (whose variation is not similar to those of) the monitor elements P1 and P2 already determined as installation positions of monitors, is determined as an installation position of a monitor in descending order of yield sensitivity from among the set of the candidates P1 to P4 narrowed down from the circuit element group. As a result, more variations can be covered.

Figure 13:
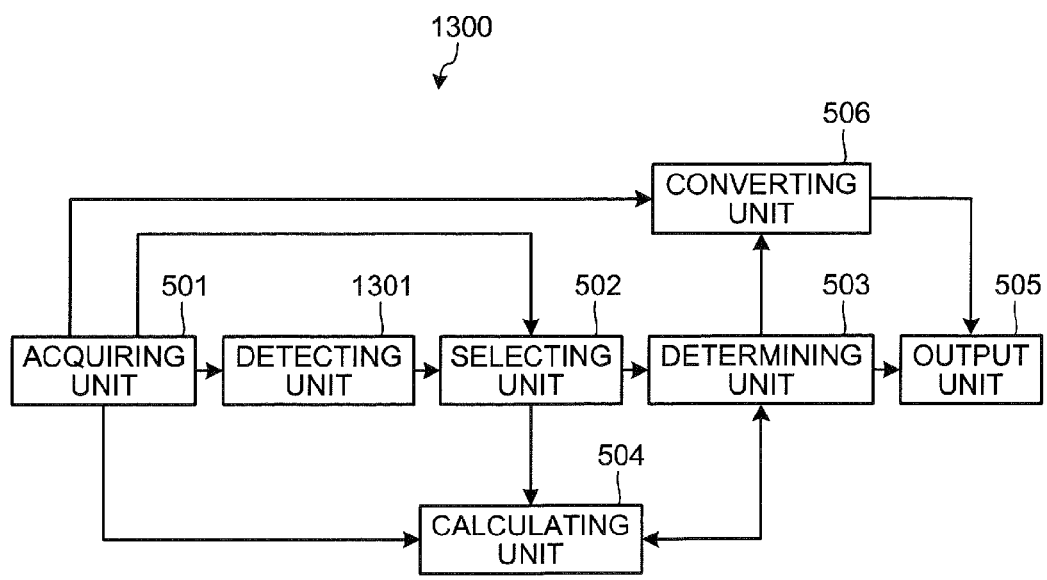
FIG. 13 is a functional diagram of the monitor position determining apparatus according to a second embodiment.

FIG. 13 is a functional diagram of a monitor position determining apparatus according to the second embodiment. A monitor position determining apparatus 1300 includes the acquiring unit 501, the selecting unit 502, the determining unit 503, the calculating unit 504, the output unit 505, the converting unit 506, and a detecting unit 1301. A function of a control unit (the acquiring unit 501 to the converting unit 506, and the detecting unit 1301) is realized by the CPU 301 executing a program stored in a storage area, such as the ROM 302, the RAM 303, the magnetic disk 305, and the optical disk 307 depicted in FIG. 3 or by using the I/F 309.

The detecting unit 1301 has a function of detecting, based on yield sensitivity data acquired by the acquiring unit 501 and from among a circuit element group arranged in a layout of a semiconductor device, a set of circuit elements (a set of candidates for monitor elements) each having a yield sensitivity equal to or above a preset threshold value. Specifically, for example, the parameter/yield sensitivity table 400 depicted in FIG. 4 is referenced to detect a set of candidates each having a yield sensitivity equal to or above a preset threshold value Sc.

The threshold value Sc may be input by a user manipulation of the keyboard 310 or the mouse 311 depicted in FIG. 3 or may be acquired based on extraction from a database or a library. The input threshold value Sc and an obtained detection result are stored in a storage area, such as the RAM 303, the magnetic disk 305, and the optical disk 307.

The selecting unit 502 selects an arbitrary circuit element from the candidate set detected by the detecting unit 1301. Specifically, for example, a circuit element having the highest yield sensitivity may be selected from the candidate set. The determining unit 503 then determines the arrangement position of the circuit element selected by the selecting unit 502 to be an installation position of a monitor.

The selecting unit 502 further selects, from the candidate set, an unselected circuit element that has not been determined as an installation position of a monitor. The calculating unit 504 calculates, based on design data acquired by the acquiring unit 501, a degree of similarity between fabrication variations of the undetermined circuit element that is selected by the selecting unit 502 and has not been determined to be an installation position of a monitor and the circuit element that has been determined to be an installation position of a monitor by the determining unit 503.

Specifically, for example, a distance between a vector obtained by arranging design data concerning an undetermined circuit element (hereinafter, "undetermined element") that has not been determined as an installation position of a monitor in a vector space and a vector obtained by arranging design data concerning a circuit element that has been determined as an installation position of a monitor (a monitor element) in the vector space may be calculated.

More specifically, for example, a distance $d(\alpha,\beta)$ between a vector of an undetermined element $P\alpha$ and a vector of a monitor element $P\beta$ can be obtained using equation (5), where $\alpha$ is a circuit element number of the undetermined element (a number part of a circuit element ID) and $\beta$ is a circuit element number of the monitor element. It is assumed that parameters that are variation factors include an X coordinate and a Y coordinate of an arrangement position, a gate length, and a gate width of each of the circuit elements P1 to Pn.

It is further assumed that a set of candidates each having a yield sensitivity equal to or above the preset threshold value Sc includes the circuit elements P1 to PN among the circuit elements P1 to Pn, and a set of circuit element numbers of these circuit elements is IC (IC=1, 2, . . . , N). A set of circuit element numbers of monitor elements is IM. A relationship of $\alpha \epsilon IC$ and $\beta \epsilon IM$ is achieved with respect to each circuit element number.

$$d(\alpha,\beta)=a_X(X\alpha-X\beta)2+a_Y(Y\alpha-Y\beta)2+a_L(L\alpha-L\beta)2+a_W(W\alpha-W\beta)2 \quad (5)$$

The determining unit 503 determines the installation position of each monitor based on a calculation result obtained by the calculating unit 504. Specifically, for example, the arrangement position of a circuit element having the largest inter-vector distance calculated by the calculating unit 504 and among the undetermined circuit elements that have not been determined as installation positions of monitors may be determined to be an installation position of a monitor.

More specifically, for example, using equation (6) where $d(\alpha)$ is the largest distance between a vector of the undetermined element $P\alpha$ and a vector of the monitor element $P\beta$, a circuit element having the largest inter-vector distance can be specified from among undetermined circuit elements that have not been determined to be installation positions of monitors.

$$d(\alpha) = \min\beta \epsilon_{IM} d(\alpha,\beta) \qquad (6)$$

The determining unit 503 determines, as an installation position of a monitor, the arrangement position of the undetermined element Pα associated with d(α) obtained using equation (6). Equations (5) and (6) may be input by a user manipulation of, e.g., the keyboard 310 or the mouse 311, or may be acquired based on extraction from a database or a library. The input equations (5) and (6) are stored in a storage area, such as the RAM 303, the magnetic disk 305, and the optical disk 307.

Figure 14:
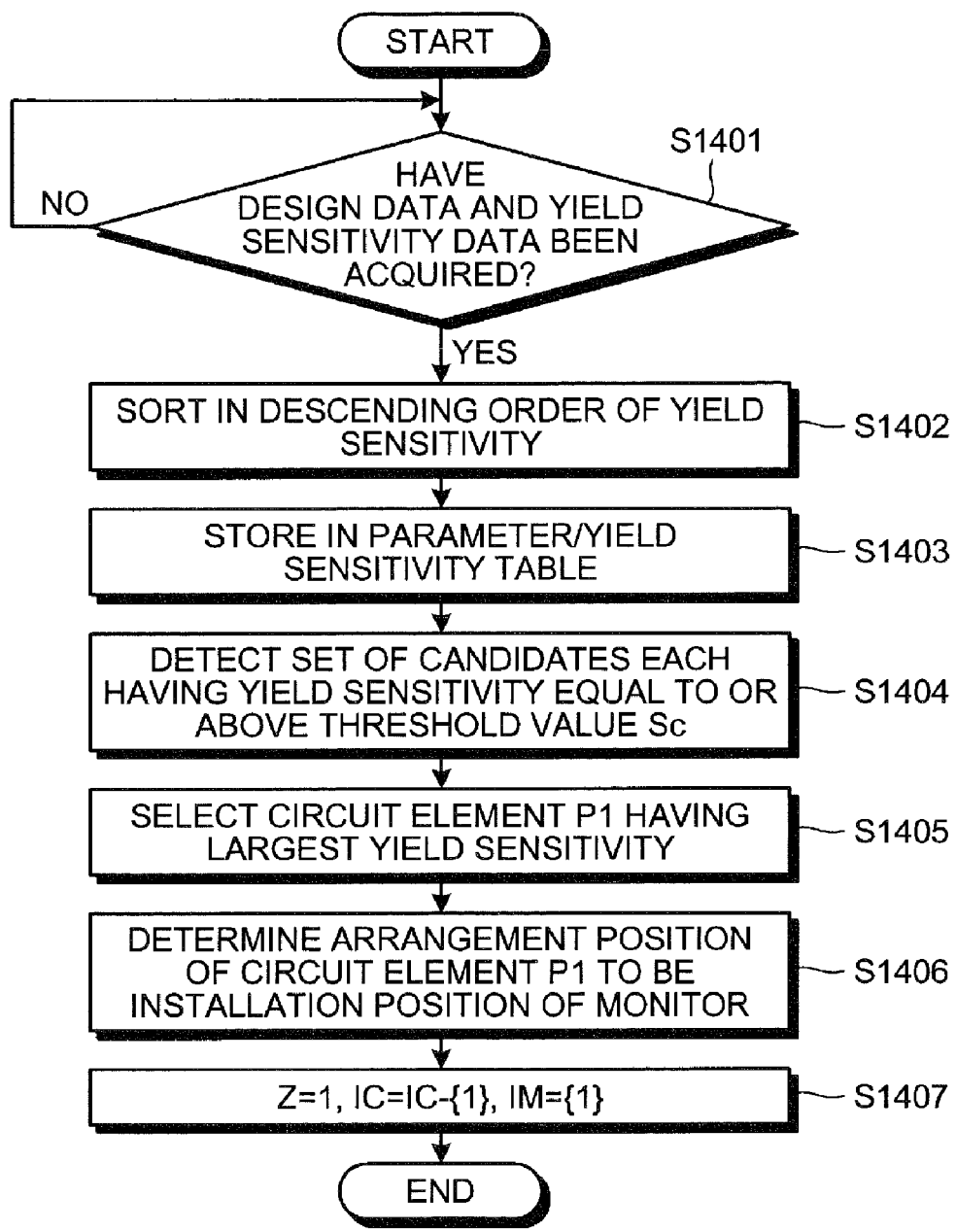
FIGS. 14 and 15 are flowcharts of an example of processing for determining monitor position.
Figure 15:
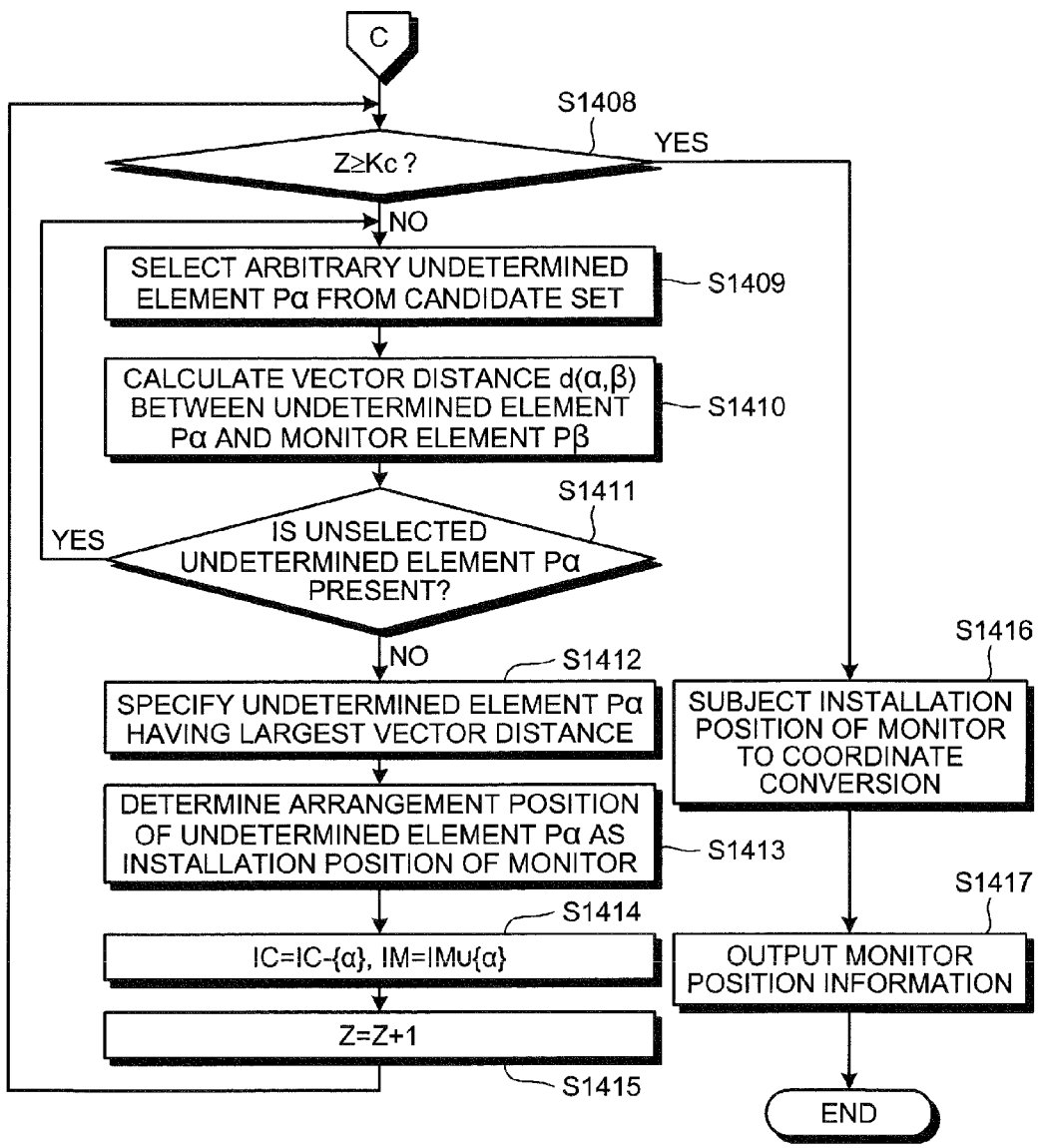

FIGS. 14 and 15 are flowcharts of an example of processing by the monitor position determining apparatus 1300 to determine monitor position.

As depicted in the flowchart of FIG. 14, it is determined whether the acquiring unit 501 has acquired design data concerning each circuit element arranged in the layout of the semiconductor device formed on the semiconductor wafer and for each circuit element, yield sensitivity data indicative of a percentage of a change with respect to a yield ratio of the semiconductor device (step S1401).

Waiting occurs for the design data and the yield sensitivity data to be acquired (step S1401: NO); if the data are acquired (step S1401: YES), the design data and the yield sensitivity data are sorted in descending order of yield sensitivity (step S1402) and stored in the parameter/yield sensitivity table 400 (step S1403).

The detecting unit 1301 refers to the parameter/yield sensitivity table 400 to detect a set of monitor element candidates each having a yield sensitivity equal to or above the preset threshold value Sc from among the circuit elements P1 to Pn (step S1404). The selecting unit 502 refers to the parameter/yield sensitivity table 400 to select the circuit element P1 having the greatest yield sensitivity among the candidate set (step S1405).

Subsequently, the determining unit 503 determines the arrangement position of the circuit element P1 to be an installation position of a monitor (step S1406), sets the number of monitor elements Z to Z=1, deletes a circuit element number 1 of the circuit element P1 from the circuit element number set IC of the candidate set, and registers the circuit element number 1 in the circuit element number set IM of the monitor elements (step S1407), and the processing advances to step S1408 depicted in FIG. 15.

As depicted in the flowchart of FIG. 15, it is determined whether "Z≧Kc" is true (step S1408). If "Z<Kc" is true (step S1408: NO), the selecting unit 502 selects, from the candidate set, an arbitrary undetermined element Pα that has not been determined to be an installation position of a monitor (step S1409).

The calculating unit 504 calculates a vector distance d(α,β) between the undetermined element Pα and the monitor element Pβ (step S1410). Kc is the number of monitors that can be provided in the semiconductor device. It is determined whether an undetermined element Pα that has yet to be selected from the candidate set is present (step S1411). If an undetermined element Pα that has yet to be selected is present (step S1411: YES), the processing returns to step S1409.

If an undetermined element Pα that has yet to be selected is not present (step S1411: NO), the determining unit 503 specifies the undetermined element Pα having the largest vector distance d(α,β) calculated at the step S1410 (step S1412) and determines the arrangement position of the specified undetermined element Pα to be an installation position of a monitor (step S1413).

Then, a circuit element number α of the undetermined element Pα is deleted from the circuit element number set IC of the candidate set, the circuit element number α is added to the circuit element number set IM of the monitor elements (step S1414), the number of monitor elements Z is incremented by one (step S1415), and the processing returns to step S1408.

If "Z≧Kc" is true at the step S1408 (step S1408: YES), the converting unit 506 uses an original point position of the semiconductor device on the semiconductor wafer and the arrangement position of the monitor element determined as an installation position of a monitor by the determining unit 503 to convert the installation position of the monitor in the coordinate system of the semiconductor device into an installation position of the monitor in the coordinate system of the semiconductor wafer (step S1416).

Lastly, the output unit 505 outputs monitor position information indicative of the converted installation position of the monitor obtained by the converting unit 506 (step S1417), thereby terminating a series of processing based on this flowchart.

According to the second embodiment explained above, the monitor element candidate set can be arbitrarily narrowed down by providing the threshold value Sc concerning the yield sensitivities. For example, when the threshold value Sc concerning the yield sensitivities is set to a low value, the processing time tends to increase as the number of circuit elements included in the candidate set increases; however, product quality can be improved. On the other hand, when the threshold value Sc is set to a high value, the processing time can be reduced while maintaining the product quality to some extent.

The arrangement position of a circuit element, having the largest vector distance from a monitor element (a circuit element already determined to be an installation position of a monitor) and among undetermined elements included in the candidate set, can be determined to be an installation position of a monitor. As a result, the installation positions of the monitors can be appropriately dispersed to the arrangement positions of circuit elements having different variations, enabling control of more variations.

The monitor position determining method explained in the present embodiments can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The monitor position determining apparatuses 300, 1300 described in the present embodiments can be realized by an application specific integrated circuit (ASIC) such as a standard cell or a structured ASIC, or a programmable logic device (PLD) such as a field-programmable gate array (FPGA). Specifically, for example, functions of the monitor position determining apparatuses 300, 1300 (the acquiring unit 501 to the converting unit 506, the detecting unit 1301) are defined in hardware description language (HDL) which is logically synthesized and applied to the ASIC, the PLD, etc., thereby enabling fabrication of the monitor position determining apparatuses 300, 1300.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A monitor position determining apparatus comprising:
   an acquiring unit that acquires design data concerning circuit elements arranged in a layout of a semiconductor device and for each of the circuit elements, yield sensitivity data indicative of a percentage of change with respect to a yield ratio of the semiconductor device;
   a selecting unit that selects, based on the yield sensitivity data acquired by the acquiring unit, a circuit element from a circuit element group arranged in the layout;
   a determining unit that determines an arrangement position in the layout to be an installation position of a monitor that measures a physical amount in the semiconductor device in a measurement region, the arrangement position being of the circuit element that is specified from the design data acquired by the acquiring unit and selected by the selecting unit; and
   an output unit that outputs the installation position determined by the determining unit.

2. The monitor position determining apparatus according to claim 1, wherein the selecting unit selects from the circuit element group, a circuit element having a greatest yield sensitivity that is a percentage of change with respect to a yield ratio of the semiconductor device.

3. The monitor position determining apparatus according to claim 2, further comprising
   a calculating unit that calculates a degree of similarity between variations of the circuit elements, the variations being related to a fabrication process, wherein the selecting unit selects a circuit element having the greatest yield sensitivity among circuit elements that have yet to be selected from the circuit element group, the calculating unit calculates, based on the design data, a degree of similarity between the variations of the circuit element selected by the selecting unit and a circuit element whose arrangement position has been determined to be an installation position of a monitor by the determining unit, and the determining unit determines, based on a calculation result obtained by the calculating unit, the arrangement position of the circuit element selected by the selecting unit to be an installation position of a monitor.

4. The monitor position determining apparatus according to claim 3, wherein the calculating unit calculates a distance between a first vector obtained by arranging, in a vector space, design data concerning the circuit element selected by the selecting unit and a second vector obtained by arranging, in the vector space, design data concerning the circuit element whose arrangement position has been determined to be an installation position of a monitor by the determining unit, and the determining unit determines the arrangement position of the circuit element selected by the selecting unit to be an installation position of a monitor when the distance between the first and the second vectors calculated by the calculating unit is equal to or greater than a given value.

5. The monitor position determining apparatus according to claim 3, wherein the yield sensitivity data is yield sensitivity data with respect to at least one of a circuit delay and a leak fluctuation of a semiconductor device.

6. The monitor position determining apparatus according to claim 1, further comprising
   a detecting unit that detects, based on the yield sensitivity data acquired by the acquiring unit and from among the circuit element group, a set of circuit elements each having a yield sensitivity equal to or greater than a given value, wherein the selecting unit selects a circuit element from the circuit element set detected by the detecting unit.

7. The monitor position determining apparatus according to claim 6, wherein the selecting unit selects a circuit element having a greatest yield sensitivity among the circuit element set.

8. The monitor position determining apparatus according to claim 7, further comprising
   a calculating unit that calculates a degree of similarity between variations of a circuit element whose arrangement position is not determined to be an installation position of a monitor and a circuit element whose arrangement position has been determined to be an installation position of a monitor by the determining unit, the variations being related to a fabrication process, wherein the selecting unit selects from the circuit element set detected by the detecting unit, the circuit element whose arrangement position is not determined to be an installation position of a monitor, the calculating unit calculates, based on the design data acquired by the acquiring unit, a degree of similarity between the variations of the circuit element that is selected by the selecting unit and whose arrangement position is not determined to be an installation position of a monitor and the circuit element whose arrangement position has been determined to be an installation position of a monitor, and the determining unit determines an installation position of a monitor based on a calculation result obtained by the calculating unit.

9. The monitor position determining apparatus according to claim 8, wherein the calculating unit calculates a distance between a vector obtained by arranging, in a vector space, design data concerning the circuit element whose arrangement position is not determined to be an installation position of a monitor and a vector obtained by arranging, in the vector space, design data concerning the circuit element whose arrangement position has been determined to be an installation position of a monitor by the determining unit, and the determining unit determines, to be an installation position of a monitor, an arrangement position of a circuit element having a largest inter-vector distance calculated by the calculating unit among the circuit elements that are not determined to be installation positions of monitors.

10. The monitor position determining apparatus according to claim 1, further comprising
    a converting unit that uses an original point position of the semiconductor device on a semiconductor wafer and the arrangement position determined to be an installation position of a monitor by the determining unit to convert the installation position of the monitor in a coordinate system of the semiconductor device into an installation position of the monitor in a coordinate system of the semiconductor wafer, wherein the output unit outputs the converted installation position of the monitor obtained by the converting unit.

11. A monitor position determining method comprising:
executing by a computer operations of:
acquiring design data concerning circuit elements arranged in a layout of a semiconductor device and for each of the circuit elements, yield sensitivity data indicative of a percentage of change with respect to a yield ratio of the semiconductor device;

selecting, based on the yield sensitivity data acquired at the acquiring, a circuit element from a circuit element group arranged in the layout;

determining an arrangement position in the layout to be an installation position of a monitor that measures a physical amount in the semiconductor device in a measurement region, the arrangement position being of the circuit element that is specified from the design data acquired at the acquiring and selected at the selecting; and outputting the installation position of the monitor determined at the determining.

* * * * *